United States Patent [19]

von der Ropp

[11] Patent Number: 5,574,694
[45] Date of Patent: Nov. 12, 1996

[54] INTEGRATED SEMICONDUCTOR MEMORY CIRCUIT AND METHOD FOR ITS OPERATION

[75] Inventor: Thomas von der Ropp, Germering, Germany

[73] Assignee: Siemens Aktiengesellschaft, Munich, Germany

[21] Appl. No.: 371,827

[22] Filed: Jan. 12, 1995

[30] Foreign Application Priority Data

Jan. 12, 1994 [DE] Germany .......................... 44 00 699.3

[51] Int. Cl.$^6$ ........................................ G11C 11/40
[52] U.S. Cl. .................... 365/203; 365/210; 365/206; 365/189.09; 365/149
[58] Field of Search .................. 365/203, 189.01, 365/210, 206, 189.09, 149

[56] References Cited

U.S. PATENT DOCUMENTS

| 4,027,294 | 5/1977 | Meusburger et al. . | |
|---|---|---|---|
| 4,598,389 | 7/1986 | Duvvury et al. . | |
| 4,658,382 | 4/1987 | Tran et al. . | |
| 4,716,549 | 12/1987 | Nakano et al. | 365/203 |
| 4,907,200 | 3/1990 | Ikawa et al. | 365/189.09 |
| 4,982,367 | 1/1991 | Miyatake | 365/203 |
| 5,091,885 | 2/1992 | Ohsawa | 365/203 |
| 5,255,235 | 10/1993 | Miyatake | 365/203 |
| 5,291,437 | 3/1994 | Rountree | 365/149 |
| 5,301,157 | 4/1994 | Roberts | 365/203 |

FOREIGN PATENT DOCUMENTS 0398245  11/1990  European Pat. Off. .

OTHER PUBLICATIONS

IBM Technical Disclosure Bulletin vol. 34, No. 8, Jan. 1992, pp. 147–149, "Dummy Cell for Open–. . . ".

Primary Examiner—Viet Q. Nguyen
Attorney, Agent, or Firm—Herbert L. Lerner; Laurence A. Greenberg

[57] ABSTRACT

In an integrated semiconductor memory circuit and a method for its operation, the circuit includes devices by means of which second electrodes of memory capacitors of dummy memory cells are acted upon by a precharging potential. The precharging potential has a value being 5 to 35% greater than a value of half a difference between a supply voltage potential and a reference potential.

2 Claims, 1 Drawing Sheet

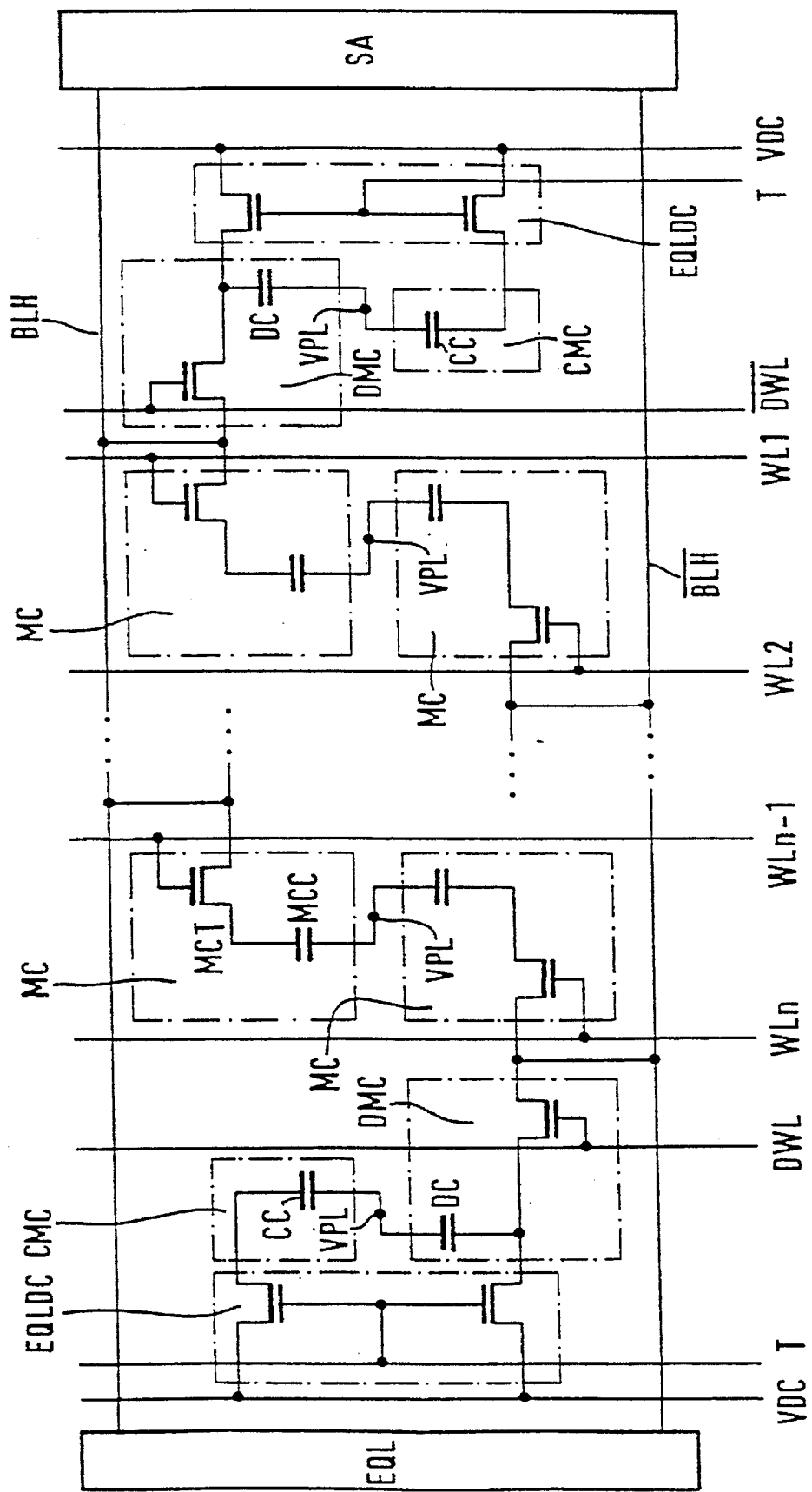

INTEGRATED SEMICONDUCTOR MEMORY CIRCUIT AND METHOD FOR ITS OPERATION

BACKGROUND OF THE INVENTION

1. Field of the Invention

The invention relates to an integrated semiconductor memory circuit having a supply voltage potential and a reference potential; one-transistor memory cells each containing one selection transistor and at least one memory capacitor and being disposed in matrix-like fashion at intersection points of word lines and bit lines; each bit line being formed of two bit line halves; each memory cell being connected on one hand through its selection transistor to a respective bit line half, and on the other hand a first electrode of the at least one memory capacitor being connected during operation to a plate potential of a predetermined value; at least one dummy memory cell likewise containing at least one memory capacitor per bit line half, and a first electrode of the at least one memory capacitor being connected during operation to the plate potential. The invention also relates to a method for operating the circuit.

In integrated semiconductor memory circuits, it is generally conventional, before a readout of data from the memory cells MC, to preload the bit lines BL to a bit line potential VBL (which is generally referred to as a precharging operation or precharge potential). The purpose being served is for read amplifiers SA (which after all are generally flip-flop circuits that operate differentially) to be supplied effectively only with those reading signals, after the readout for weighting and amplification of the reading signals, since the bit line potential VBL is present with the same value at both inputs of the read amplifiers SA and therefore is ignored by the differentially functioning read amplifiers SA. While in the past, either the supply potential VDD or the reference potential VSS was usually applied as the bit line potential VBL, today a value is typically applied that is equivalent to half the difference between the supply voltage potential VDD and the reference potential VSS, or else in semiconductor memory circuits of the kind that operate with a so-called internal supply voltage potential VDDint internally of the circuit that is reduced as compared with the supply potential VDD applied to the finished component, the corresponding half difference between the internal supply voltage potential VDDint and the reference potential VSS is currently applied.

If the conventional semiconductor memory circuit also has so-called dummy cells, then conventionally they too are charged to the bit line potential VBL.

Integrated semiconductor memory circuits, especially of the one-transistor memory cell type (so-called 1T DRAMs or embedded 1T DRAMs), are known to be vulnerable to so-called soft errors, or in other words alpha rays, which typically originate in the component housing being used. Experiments have shown that conventional semiconductor memory circuits react variously strongly to such alpha rays, depending on whether a datum was to be memorized as a physical 0 or as a physical 1 (a physical 0 can correspond to either a logical 0 datum or a logical 1 datum; the relationship depends on the particular circuitry being chosen). It has been demonstrated that that is due to so-called weighting asymmetry of the reading amplifiers SA, so that a memorized datum of physical 0, for instance, cannot be read out with the same certainty and the same margin of safety as a memorized physical 1 datum, and vice versa. However, that means that the danger of the occurrence of soft errors increases for one type of datum while it decreases for the other. That is undesirable, since what one wants is equally good security against soft errors for both types of datum.

A remedy that has presented itself is to enlarge the memory cell capacities, which would make the reading signal greater and thus make the semiconductor memory circuit more secure against soft errors. However, that course cannot be taken in practice because it would result in a lateral and/or three-dimensional enlargement of the memory cells, which given present demands for miniaturization of semiconductor memory circuits is undesirable (the consequence would be larger memory chips and possibly larger housings needed for them, which might then no longer meet prevailing standards).

SUMMARY OF THE INVENTION

It is accordingly an object of the invention to provide an integrated semiconductor memory circuit and a method for its operation, which overcome the hereinafore-mentioned disadvantages of the heretofore-known devices and methods of this general type and which optimize such integrated semiconductor memory circuits in such a way that their reading amplifiers can detect data of physical 0 and physical 1 with approximately the same certainty (so-called symmetrizing of reading amplifiers for physical zero and physical 1), without having to enlarge memory cells for that purpose and without any sacrifice in security against soft errors.

With the foregoing and other objects in view there is provided, in accordance with the invention, an integrated semiconductor memory circuit, comprising a supply voltage potential and a reference potential; bit lines each being formed of two bit line halves; word lines defining intersection points with the bit lines; one-transistor memory cells being disposed in matrix-like fashion at the intersection points, each of the memory cells having one selection transistor and at least one memory capacitor having an electrode; the selection transistor of each of the memory cells being connected to a respective one of the bit line halves; the electrode of the at least one memory capacitor of each of the memory cells being connected during operation to a plate potential of a predetermined value; at least one dummy memory cell having at least one memory capacitor for each respective bit line half with first and second electrodes; the first electrode of the at least one memory capacitor being connected during operation to the plate potential; and devices for causing the second electrode of the at least one memory capacitor of the at least one dummy memory cell to be acted upon during operation with a precharging potential having a value being 5 to 35% greater than a value of half a difference between the supply voltage potential and the reference potential.

In accordance with another feature of the invention, there is provided at least one friendly cell for each respective bit line half, the at least one friendly cell having at least one friendly cell capacitor with a first electrode being connected to the plate potential and a second electrode to be acted upon by the precharging potential.

With the objects of the invention in view, there is also provided a method for operating an integrated semiconductor memory circuit, which comprises precharging the bit lines to a bit line potential, prior to a readout of data stored in memory cells; and applying the precharging potential to the second electrodes of the memory capacitors of the dummy memory cells, in the precharging of the bit lines.

In accordance with another mode of the invention, there is provided a method which comprises also applying the precharging potential to the second electrodes of the friendly cell capacitors, in the precharging of the bit lines.

In accordance with a concomitant mode of the invention, there is provided a method which comprises applying the precharging potential with a value being 5 to 35% greater than a value of half a difference between the supply voltage potential and reference potential.

The present invention makes it possible to lower the soft error rate by two orders of magnitude, in comparison with the known semiconductor memory circuits of the same generic type.

Other features which are considered as characteristic for the invention are set forth in the appended claims.

Although the invention is illustrated and described herein as embodied in an integrated semiconductor memory circuit and a method for its operation, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

BRIEF DESCRIPTION OF THE DRAWING

The FIGURE of the drawing is a schematic circuit diagram in conjunction with which the invention and advantageous further features will be described below.

DESCRIPTION OF THE PREFERRED EMBODIMENT

Referring now to the single FIGURE of the drawing in detail, there is seen a portion of a semiconductor memory circuit according to the invention, in which only that which is essential to the invention has been shown, for the sake of simplicity. The drawing shows a bit line BL with two bit line halves BLH, $\overline{BLH}$ thereof, having one side which is connected to a reading amplifier SA and another side which is connected to a precharging device EQL for precharging and (with respect to its electrical potential) rectifying the bit line halves BLH, $\overline{BLH}$ to a bit line potential VBL prior to a readout of data from memory cells MC. Memory cells MC of the one-transistor type which are also shown (with selection transistors MCT and memory capacitors MCC), are connected on one hand to the respective bit line halves BLH, $\overline{BLH}$ and on the other hand are all connected in common (at first electrodes of their memory capacitors MCC) to a so-called plate potential VPL. This potential has essentially half the value of a difference between a supply voltage potential VDD (or an internal supply potential VDDint) and a reference potential VSS. Thus it is essentially equal to the bit line potential VBL, which can be applied to the bit lines BL through the precharging device EQL. The plate potential VPL could also have essentially the same value as the supply voltage potential VDD (or the internal supply voltage potential VDDint) or the reference potential VSS, as was usual in the past.

The drawing also shows word lines WL (which are sequentially numbered from WL1 through WLn) for triggering the selection transistors MCT of the memory cells MC. Accordingly, in the generally usual way, the memory cells MC are located at intersection points between the word lines WL and the bit lines BL and are connectable to the respective bit lines BL or bit line halves BLH; $\overline{BLH}$, through their selection transistors MCT for reading and storing information.

Each bit line half BLH, $\overline{BLH}$ has a so-called dummy cell DMC (for instance at its ends as shown), which is also of the one-transistor cell type. As is generally known, the purpose of this is to achieve a uniform, symmetrical load on the differentially operating reading amplifiers SA during operation. Memory capacitors DC of the dummy cells DMC are likewise connected to the plate potential VPL by first electrodes thereof.

Although the drawing also shows peripheral cells CMC, which are generally known as "friendly cells" they will not be described until later, because they are not absolutely necessary for the present invention.

The semiconductor memory circuit described thus far is entirely equivalent to the prior art. However, according to the invention that semiconductor memory circuit additionally has devices EQLDC by means of which second electrodes of each of the memory capacitors DC of the dummy memory cells DMC can be acted upon during operation with a precharging potential VDC. This is performed in accordance with the invention during the (conventional) precharging of the bit lines BL to the bit line potential VBL. According to the invention, the value of the precharging potential VDC is from 5 to 35% greater than the value of half the difference between the supply voltage potential VDD (or VDDint if an internal supply voltage potential is used) and the reference potential VSS.

As is shown, by way of example, the devices EQLDC may contain transistors which are connected on one hand to the precharging potential VDC and on the other hand to the second electrodes of the memory capacitors DC of the dummy cells DMC. The transistors are triggered at their gate by a precharging clock signal T, which switches the transistors to be conductive at the moment of precharging. The precharging clock signal T may have the same course over time as a corresponding non-illustrated clock signal which controls the precharging of the bit lines BL to their bit line potential VBL, before a readout of data from the memory cells MC.

As already noted, the FIGURE also shows the presence of peripheral cells CMC, which are generally known by the term "friendly cells". The function of the friendly cells is known to one skilled in the art. They may, as shown herein, merely include friendly cell capacitors CC. Alternatively, they may furthermore contain transistors, similar to the selection transistors MCT of the memory cells MC or those of the dummy cells DMC. Advantageously, in the present invention, first electrodes of the friendly cell capacitors CC are connected to the plate potential VPL, and second electrodes of these friendly cell capacitors CC can likewise be acted upon by the precharging potential VDC of the dummy cells DMC, by means of the equalizing devices EQLDC for the dummy cells DMC. The result is even better symmetrizing of the working and load conditions of the reading amplifiers SA both upon readout and upon weighting and amplification of the read-out data.

I claim:

1. An integrated semiconductor memory circuit, comprising:

a supply voltage potential and a reference potential;

bit lines each being formed of two bit line halves;

word lines defining intersection points with said bit lines;

one-transistor memory cells being disposed in matrix-like fashion at said intersection points, each of said memory cells having one selection transistor and one memory capacitor having an electrode;

said selection transistor of each of said memory cells being connected to a respective one of said bit line halves;

the electrode of said memory capacitor of each of said memory cells being connected during operation to a plate potential of a predetermined value;

at least one dummy memory cell having at least one dummy memory capacitor for each respective bit line half with first and second electrodes;

the first electrode of said at least one dummy memory capacitor being connected during operation to the plate potential; and devices for causing the second electrode of said at least one dummy memory capacitor of said at least one dummy memory cell to be acted upon during operation with a precharging potential having a value being 5 to 35% greater than a value of half a difference between the supply voltage potential and the reference potential.

2. A method for operating an integrated semiconductor memory circuit having a supply voltage potential and a reference potential; bit lines each being formed of two bit line halves; word lines defining intersection points with the bit lines; one-transistor memory cells being disposed in matrix-like fashion at the intersection points, each of the memory cells having one selection transistor and one memory capacitor having an electrode; the selection transistor of each of the memory cells being connected to a respective one of the bit line halves; the electrode of the memory capacitor of each of the memory cells being connected during operation to a plate potential of a predetermined value; at least one dummy memory cell having at least one dummy memory capacitor for each respective bit line half with first and second electrodes; the first electrode of the at least one dummy memory capacitor being connected during operation to the plate potential; and devices for causing the second electrode of the at least one dummy memory capacitor of the at least one dummy memory cell to be acted upon during operation with a precharging potential, which comprises:

precharging the bit lines to a bit line potential, prior to a readout of data stored in memory cells; and applying the precharging potential with a value being 5 to 35% greater than a value of half a difference between the supply voltage and the reference potential to the second electrodes of the dummy memory capacitors of the dummy memory cells, in the precharging of the bit lines.

* * * * *